United States Patent [19]

Heald

[11] 4,112,511

[45] Sep. 5, 1978

[54] FOUR TRANSISTOR STATIC BIPOLAR MEMORY CELL USING MERGED TRANSISTORS

[75] Inventor: Raymond A. Heald, Los Gatos, Calif.

[73] Assignee: Signetics Corporation, Sunnyvale, Calif.

[21] Appl. No.: 832,940

[22] Filed: Sep. 13, 1977

[51] Int. Cl.² ..................... G11C 11/40; G11C 13/00
[52] U.S. Cl. ................................... 365/188; 365/174; 307/238
[58] Field of Search ............... 365/174, 188, 154, 156

[56] References Cited

U.S. PATENT DOCUMENTS 3,815,106   6/1974   Weidmann ..................... 365/156

*Primary Examiner*—Terrell W. Fears
*Attorney, Agent, or Firm*—Jerry A. Dinardo; Frank R. Trifari

[57] ABSTRACT

A bipolar memory cell of reduced size requires only four I²L operated transistors and three access lines. Two current injection transistors supply operating current to two inversely operated flip-flop transistors and also function as load devices as well as coupling devices. The three access lines conduct power to the cells as well as the signals for the write and read operations. A write operation is performed by ratioing the currents supplied to a memory cell array such that only a selected cell is written.

18 Claims, 8 Drawing Figures

FOUR TRANSISTOR STATIC BIPOLAR MEMORY CELL USING MERGED TRANSISTORS

BACKGROUND OF THE INVENTION

This invention relates to semiconductor memories, and particularly to a memory cell using merged transistors and capable of organization in a random access read-write memory of reduced size.

In the present state of the art merged transistors are employed in a read-write random access memory cell of such reduced size that bipolar arrays approaching the packing density of MOS storage devices may yet be attained. The key to such compact bipolar memory cells is the use of current injection transistors which replace the usual resistive loads and which feed current to inversely operated, or collector-up, flip-flop transistors. A compact bipolar memory cell of such kind is described in an article by Siegfried K. Wiedman and Horst H. Berger, entitled "Superintegrated Memory Shares Functions on Diffused Islands" published in *Electronics*, Feb. 14, 1972, pp. 83 - 86.

One drawback of the memory cell described in the above referenced article is that it requires two coupling transistors to provide access to the flip-flop or bistable device comprising the two pairs of merged transistors. Thus, there is required two coupling transistors, two current injection transistors, and two inversely operated flip-flop transistors, for a total of six transistors. In addition, there are four lines required to access the cell including power lines. It would be desirable to reduce both the number of transistors and the number of access lines to achieve an even smaller cell.

Another drawback of the above-referenced cell is that for large arrays, such as for 4K and higher number of bits, the operation is such that it is possible to write information into a selected cell during a time when information is being read. This anomalous condition may occur in a large array having a large number of coupling transistors coupling the storage cell to the read-write lines, because the coupling transistors may draw so much current from the read-write lines as to cause the selected cell to flip to its other state. This situation can be explained further by noting that during the read operation, the selected cell is sourcing current to the read-write lines, while the non-selected cells are sinking current from the same lines. In a small array the sourcing current of the selected cell with predominate over the sinking current of the non-selected cells, but in a large array it is likely that the sinking current of the non-selected cells will predominate over the sourcing current of the selected cell and cause the selected cell to be flipped to its other state, which is a write operation.

SUMMARY OF THE INVENTION

In the present invention, a bipolar memory cell is provided which employs only four bipolar transistors and only three access lines. One pair of current injection transistors source current to a pair of inversely operated flip-flop transistors. The two current injection transistors function both as load devices and as access or coupling devices, thereby dispensing with the additional two transistors that are usually needed for accessing. The number of access lines is reduced to three by having the lines serve both as the means for conducting power to the cell as well as the means for writing information into and reading information out of the cell.

DESCRIPTION OF THE PREFERRED EMBODIMENT

Figure 1:
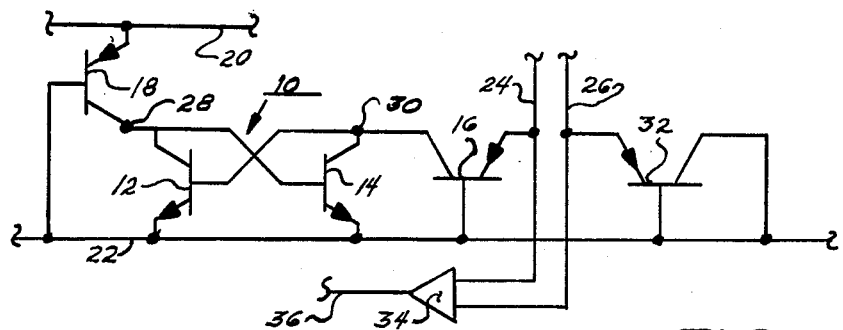
FIG. 1 is a schematic diagram of a memory cell and sensing circuit, according to the invention.

Referring now to FIG. 1, there is shown a schematic circuit of a bipolar memory cell 10 incorporating features of the invention. The memory cell 10 comprises four transistors 12, 14, 16, 18, and three access lines, hereinafter referred to as address lines 20, 22, 24. A fourth line 26, which is not an address line but rather a part of the output circuitry, is also shown and will be referred to as a dummy line.

The pair of lines 20, 22 are the $x$ address lines and the third line 24 is the $y$ address line. Thus, in a matrix array of memory cells 10 arranged in a $k$ number of horizontal rows and a like $k$ number of vertical columns, there will be a $k$ number of each of the two $x$ address lines 20, 22 extending horizontally and a like $k$ number of $y$ address lines 24 extending vertically. For the sake of clarity in the following discussion, the two $x$ address lines will be distinguished by referring to the line 20 as the upper $x$ address line and the line 22 as the lower $x$ address line.

One pair of transistors 12 and 14 function as the switching or flip-flop devices, whereas the other pair of transistors 16 and 18 function as current sources supplying power to the switching transistors 12 and 14, and as the access or coupling means by which digital information is transferred between the address lines 20, 22, 24 and the switching transistors 12 and 14. The transistors 16 and 18 will be referred to as source transistors to facilitate the description.

The emitters of the two switching transistors 12 and 14 are connected in common directly to the lower $x$ address line 22, which may be referred to as a common node point. The collectors and bases of the switching transistors 12 and 14 are cross-coupled at two additional node points 28 and 30.

The source transistor 16 is connected in series with the base of one switching transistor 12 between the $y$ address line 24 and the lower $x$ address line 22, and the other source transistor 18 is connected in series with the base of the other switching transistor 14 between the upper and lower $x$ address lines 20, 22. In particular, the source transistor 16 has its base connected directly to the lower $x$ address line 22, its emitter connected directly to the $y$ address line 24, and its collector connected directly to one node point 30. The other source transistor 18 has its base also connected directly to the lower x address line 22, its emitter connected directly to the upper x address line 20 and its collector connected directly to the other node point 28.

It is an important feature of the memory cell of this invention that there are only four transistors and only three address lines. This is accomplished by having the source transistors 16 and 18 performing multiple functions, as has been described, and by having the address lines 20, 22, 24 performing the multiple functions of supplying power to the switching transistors 12 and 14 as well as providing the means for memory cell selection. The memory cell employs the minimum number of lines, namely one x address line and one y address line, which can be used in any x and y addressing operation to change the condition of the cell during a write operation. One way this is accomplished is by ratioing the currents supplied during a write operation to the memory cells of a matrix in such a way that only the selected cell will be written without disturbing the state of any of the other cells.

To assure the proper cell selection, it is necessary also to establish a defined range of current gain, or $\beta$ values which are related to the current ratios established for supplying power to the cells. The principal criterion which must be established is that the ratio of currents supplied on the x and y address lines must be less than the $\beta$ of the switching transistors on all crossing pairs of address lines except the two selected lines, and on the two selected lines the current ratio must be greater than $\beta$, in order to force the selected cell into the desired state without affecting the state of any non-selected cell.

STANDBY CONDITION

For an understanding of the operation of the memory cell 10 it will be assumed first that the cell 10 is in standby condition and that a standby source current $I_s$ is supplied from the upper x address line 20 to the source transistor 18 and a like standby source current $I_s$ is supplied from the y address line 24 to the source transistor 16. A suitable low positive voltage slightly above a reference voltage level $V_{REF}$, typically 100 to 200 millivolts higher than the reference voltage level $V_{REF}$, is assumed to be applied to the lower x address line 22. Now if the standby source current $I_s$ from the source transistor 18 reaches the base of the switching transistor 14, then all of the standby source current $I_s$ from the other source transistor 16 will flow to the collector of the same switching transistor 14 and no current will flow to the other switching transistor 12. Transistor 14 will be ON and transistor 12 will be OFF. Conversely, if all of the standby source current $I_s$ from the source transistor 16 reaches the base of switching transistor 12, then all of the standby source current $I_s$ from the source transistor 18 will flow to the collector of switching transistor 12 and no current will flow to the switching transistor 14. Transistor 12 will now be ON and transistor 14 will be OFF.

WRITE OPERATION

If switching transistor 14 is ON, it can draw up to $\beta$ times the standby source current $I_s$ in its collector circuit, and if the other switching transistor 12 is ON it can likewise draw up to $\beta$ times the standby source current $I_s$ in its collector circuit.

As used herein, the $\beta$, or effective current gain, of an I²L switching transistor merged with its source transistor is the collector up current gain of the NPN switching transistor measured while the lateral PNP source transistor has its P region, which is separate from the NPN transistor, shorted to the epitaxial layer (NPN emitter and PNP base). Hence, the NPN switching transistor current gain is reduced due to the current injected into the lateral PNP transistor. It is assumed in this discussion of the write operation that the switching transistors 12 and 14 have the same $\beta$, or effective current gain.

Now, if switching transistor 14 is ON and it can only draw $\beta$ times $I_s$ in its collector circuit, then if current in excess of $\beta$ times $I_s$ is supplied to the collector circuit of the ON switching transistor 14, the excess current will flow to the base of other switching transistor 12, turning it ON, and ultimately all of the current from the source transistors 16 and 18 will flow through the transistor 12 and no current will flow through the transistor 14 and the latter will turn OFF. The above procedure describes a write operation, for example, in which a "1" is written into the memory cell by turning transistor 12 ON and transistor 14 OFF. The memory cell 10 was written by providing to the then ON transistor 14 more current than it could handle, thereby allowing transistor 12 to turn ON which in turn caused transistor 14 to turn OFF. For purposes of this discussion it is assumed a "1" is stored in the cell when transistor 12 is ON and transistor 14 is OFF.

It is clear from the foregoing that a selected memory cell 10 can be written by applying current of value $I_s$ to the upper x address line 20 and applying a current of value greater than $\beta$ times $I_s$ to the y address line 24. However, with current of value $I_s$ applied to every x address line of a matrix and current of value greater than $\beta$ times $I_s$ applied to a selected y address line, every cell along the selected y address line would be written. To prevent non-selected cells from being written while they are being supplied with standby source current of value $I_s$ from the x address lines, it is necessary to reduce the current from the selected y address line to some value below $\beta$ times $I_s$, but still provide a y address current that is some factor, n, times as great as the standby source current $I_s$. Stated in mathematical terms, $nI_s < \beta I_s$, or $n < \beta$. Furthermore, in order to select a particular cell for writing, the current on the selected x address line must be reduced by some factor so as to obtain a write current on the selected y address line that is greater than $\beta$ times the current on the selected x address line. As with the selected y line, the selected x line current can be related to the standby current by some factor m. Here $(I_s/m) > (I_s/\beta)$ or $m < \beta$. Thus, if $nI_s$ is the write current for the y address line and $I_s/m$ is the write current for the x address line, then $nI_s \div (I_s/m) > \beta$, and $nm > \beta$. Since the limitations on n and m are the same, it is simplifying, but not necessary to let $n = m$.

Figure 2:
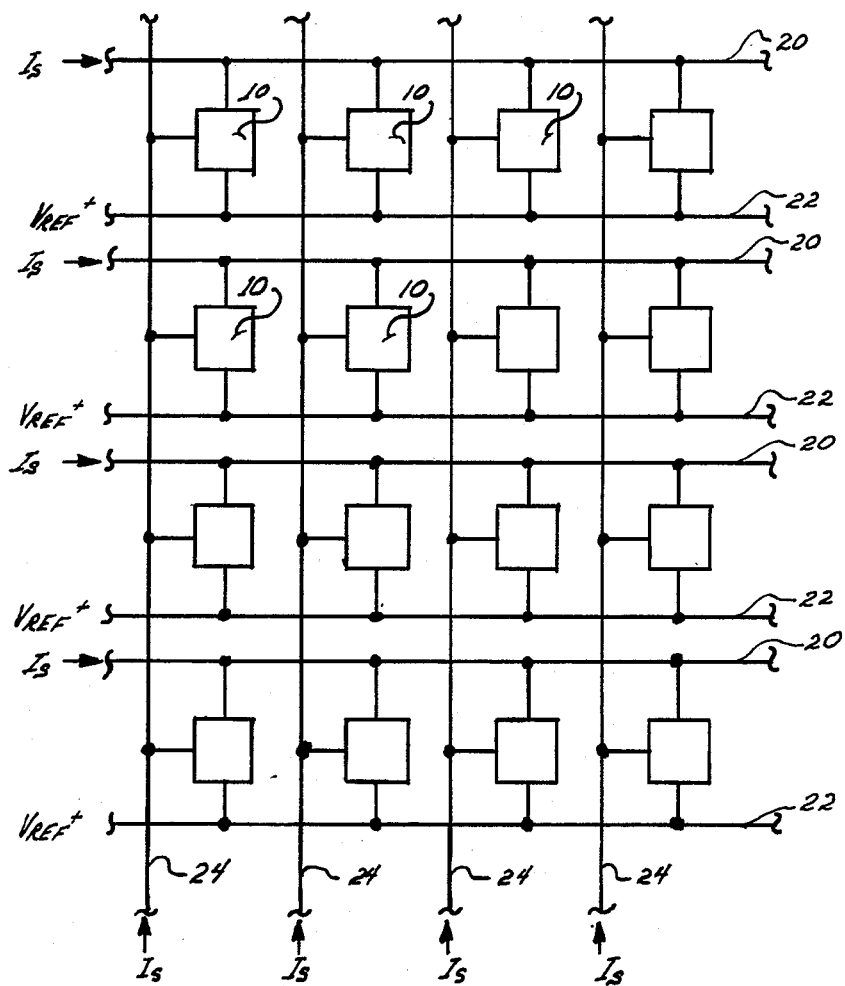
FIG. 2 is a schematic diagram showing the currents supplied to a matrix of memory cells of the invention during standby condition.
Figure 3:
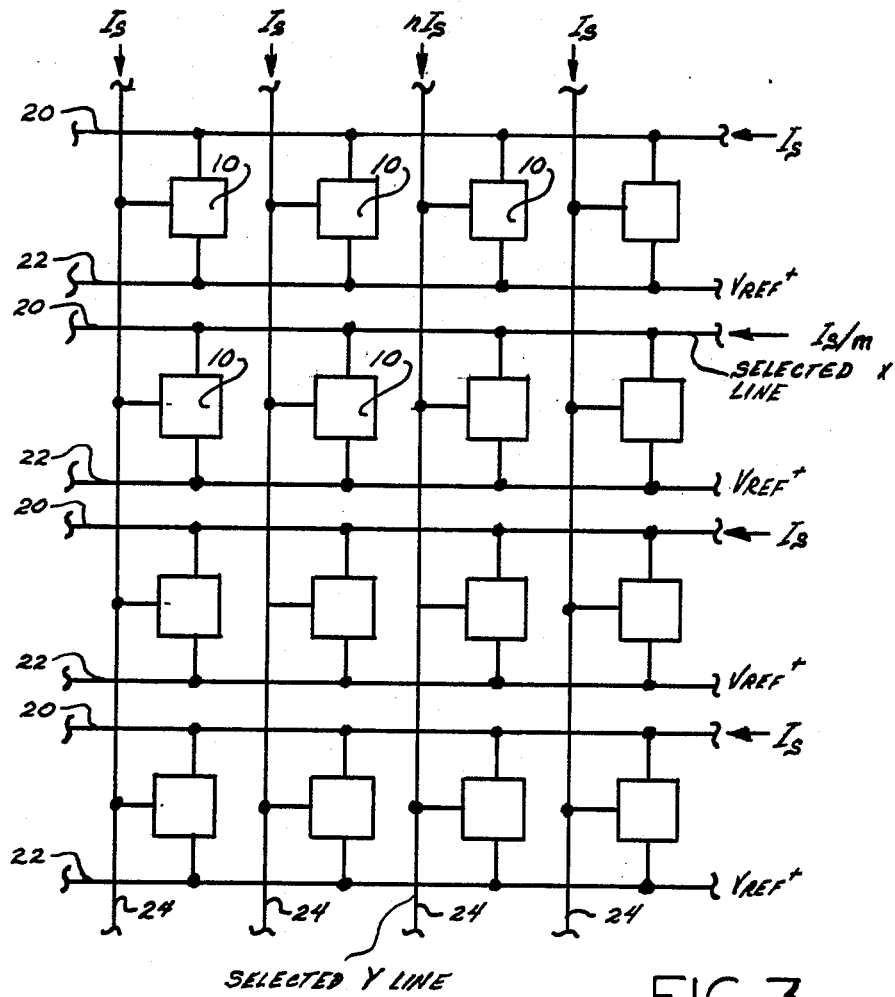
FIG. 3 is a schematic diagram showing the currents supplied to a matrix of memory cells of the invention during write condition.

FIG. 2 illustrates the current supply conditions in the x and y address lines of a 4 × 4 matrix during standby operation, and FIG. 3 illustrates the current supply conditions on the x and y address lines during a write operation. The voltage level $V_{REF}+$ on lines 22 indicates a voltage slightly higher, such as 100 to 200 millivolts higher, than the reference voltage level $V_{REF}$. The Figures summarize the discussion above and are self-explanatory. It will suffice to say that during standby operation, all x address lines 20 and y address lines 24 furnish approximately the same standby source current $I_s$ to the cells of the matrix. During the write "1" operation, the selected x address line 20 furnishes a write current of $I_s/m$, and the selected y address line 24 furnishes a write current of $nI_s$, and all non-selected x and y address lines furnish the same standby source current $I_s$. Thus, transistor 12 will turn on as is required to store a logical "1". Conversely, during a write "0" operation, the selected x address line 20 furnishes a write current of $pI_s$ and the selected y address line 24 furnishes a write current of $I_s/r$, and all non-selected x and y address lines furnish the same standby source current $I_s$. Here, as with n and m above, r and p are factors such that $r < \beta$ and $p < \beta$ with $rp > \beta$. Then transistor 14 will turn on as is required to store a logical "0". The following inequalities are self-evident:

$(nI_s/I_s/m) > \beta$, so $nm > \beta$ $(nI_s/I_s) < \beta$, so $n < \beta$ $(I_s/I_s/m) < \beta$, so $m < \beta$ Similarly $(pI_s/I_s/r) > \beta$, so $pr > \beta$ $(pI_s/I_s) < \beta$, so $p < \beta$ $(I_s/I_s/r) < \beta$, so $r < \beta$ Since the inequalities are similar, it is possible to use the same factor for all write operations by taking $n = m = p = r$. Then the inequalities for a proper write operation become:

$n^2 > \beta$ and $n < \beta$

Read Operation

Figure 4:
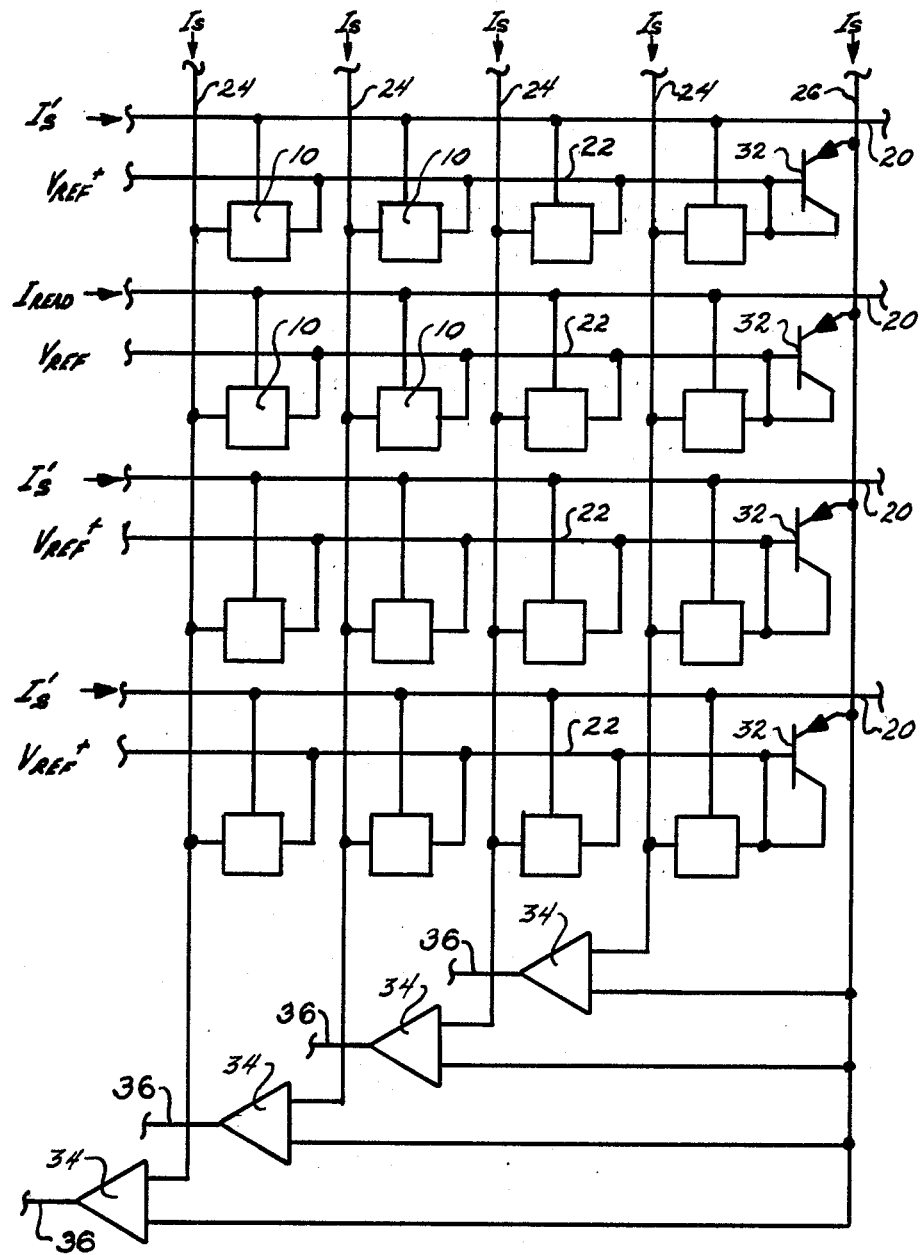
FIG. 4 is a schematic diagram showing the currents supplied to a matrix of memory cells of the invention during read condition.

Reference is now made to FIG. 4 for a description of the read operation. To read out the data stored in a memory cell 10 of the matrix the y address lines 24 each have standby source current $I_s$ applied thereto the same as in the standby condition. The changes from the standby condition are: The selected lower x address line 22 has its voltage level $V_{REF}+$ reduced by 100 to 200 millivolts to the voltage level $V_{REF}$; and the selected upper x address line is supplied with a higher current $I_{READ}$; and the non-selected upper x address lines are supplied with lower currents $I_s'$. These currents are chosen to keep the supply currents to the cells nearly balanced. In general $I_{READ}$ must be greater than the sum of all $I_s'$ currents for a usable read signal. The exact values depend upon the voltage reduction used on the selected lower x address line. Where the selected lower x address line 22 was previously held to 100 to 200 millivolts above some reference voltage level $V_{REF}$, it is now reduced to the reference voltage level $V_{REF}$. For example, if the reference voltage level $V_{REF}$ is 1 volt, the selected lower x address line would be reduced to 1 volt, and all of the non-selected lower x address lines would remain at the higher potential of 1.1 to 1.2 volts. The specific voltage values are exemplary only and are given for purposes of explanation. While other absolute values of voltage may be used, the voltage difference would normally fall within the range of 100 to 200 millivolts for best operation.

When the voltage of the selected lower x address line 22 is reduced by the given amount, every cell 10 that is connected to that line 22 will be affected. The source transistor 16 of every cell 10 connected to the selected line 22 has its base connected to the lower x address line, and when the base voltage is reduced, the emitter voltage will also be reduced by about the same amount. All of the source transistors 16 connected to the selected lower x address line 22 will draw more current from the y address lines 24 than the other source transistors 16. A 100 to 200 millivolt reduction in voltage on the lower x address line should assure that the selected source transistor 16 along a given y address line 24 will draw over 50% of the current supplied by that line 24.

Now it is necessary to sense the ON or OFF condition of the switching transistor 14 in a selected cell 10. This can be done by selecting a given y address line 24 to read out the difference in conductivity of the source transistor 16 as it is affected by the state of the switching transistor 14. When the switching transistor 14 is ON, the voltage between the selected lower x address line 22 and the selected y address line 24, which is the emitter-base diode voltage of the source transistor 16, is lower than when the switching transistor is OFF. However, this voltage difference may be only a small percentage of the emitter-base diode voltage of the source transistor 16 and may be difficult to detect.

Rather than sensing the emitter-base diode voltage of the source transistor 16, it is preferred to compare the voltage between the selected y address line 24 and a dummy line 26. The dummy line 26 is connected to a dummy transistor 32 which simulates the action of the source transistor 16 when the switching transistor 14 is ON. In other words, it simulates the source transistor 16 when the collector and base are short circuited. Thus the dummy transistor 32 has its emitter connected to the dummy line 26 and has its base and collector connected together to the lower x address line 22. Now the voltage difference between the y address line 24 and the dummy line 26 will provide a fast readout. A differential amplifier 34 connected across the y address line 24 and the dummy line 26 provides a convenient means for reading out the data at the output terminal 36.

FIG. 4 shows the matrix of memory cells 10 and the line conditions during readout. The dummy line 26 is shown located to one side of the matrix coupled to each of the lower x address lines 22. Each of the y address lines 24 may be coupled to its own separate differential amplifier 34 for simultaneous readout, as shown, or multiplexed to a single differential amplifier 34 for selective readout.

Figure 5:
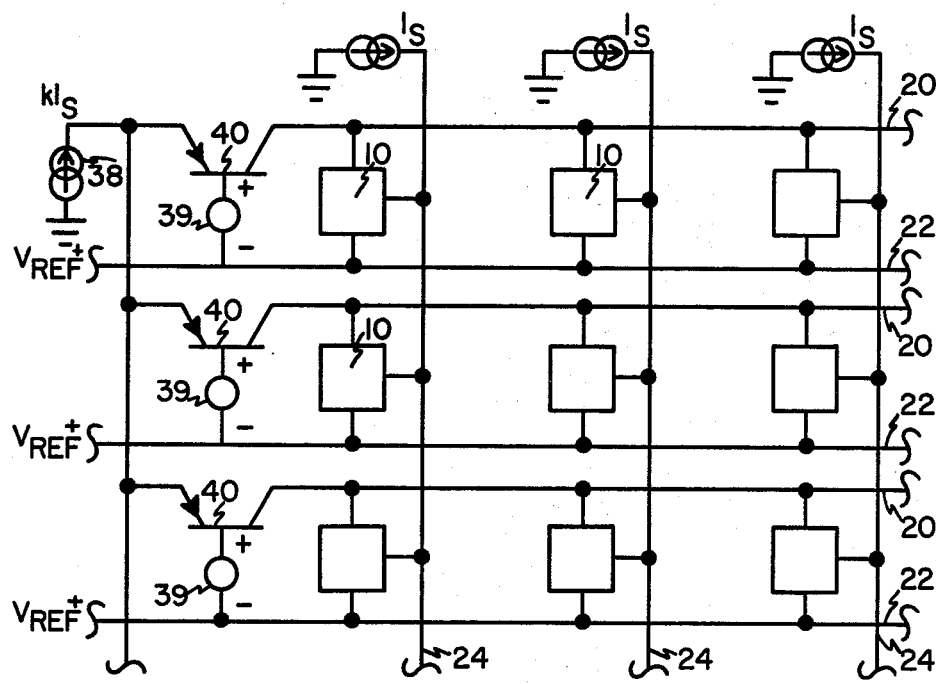
FIG. 5 is a schematic diagram showing an improved embodiment of the invention in which means are provided in a matrix of memory cells for balancing line currents during standby and readout.

Inasmuch as most of the y address line current is supplied to the cells of the selected x address line 22 during a read operation, the x address line currents should be adjusted such that no cell will be written due to current imbalance. A circuit will now be described which automatically redistributes the current to the x address line 20. As shown in FIG. 5, a common x address line current source 38 is shown feeding current in parallel to each of the emitters of a plurality of isolating transistors 40, one for each pair of x address lines 20 and 22. The collector of each isolating transistor 40 is connected to its respective upper x address 20 line, and the base is connected through a constant dc voltage source 39 to the lower x address line 22. Thus, in the same way that the source transistor 16 connected to the y address line 24 draws more current when the selected lower x address line 22 voltage is reduced, so too will the isolating transistor 40 divert more current from the common current source 38 to the selected upper x address line 20 and to the source transistor 18 connected thereto, and thus the currents to both source transistors 16 and 18 of a selected cell 10 are balanced. The circuit of FIG. 5, of course, is decoupled or its effect altered when that x address line 20 is selected for a write operation. Source 39 can be any voltage equal to or greater than zero. It is probably advantageous to set it at 0.2V or above so that the isolating transistors 40 avoid deep saturation.

Figure 6:
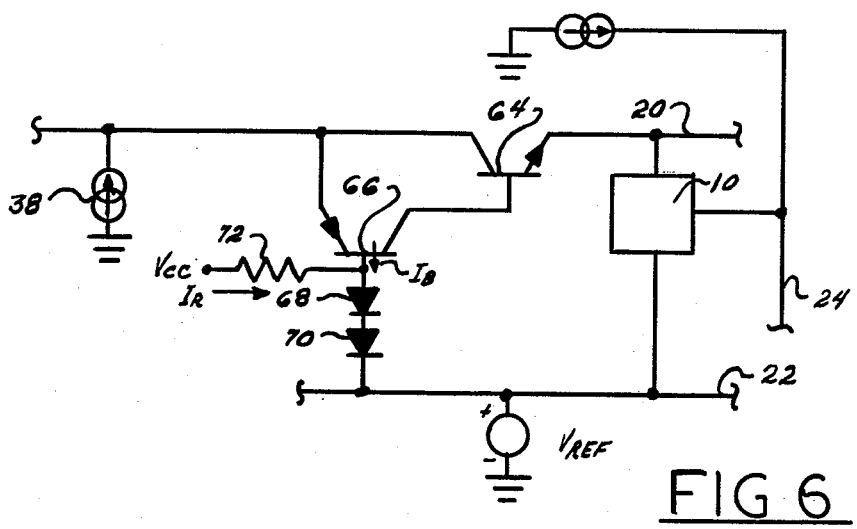
FIG. 6 is a schematic diagram of an alternate circuit for balancing line currents during standby and readout.

Many circuits are possible which realize this current sharing function. A simple circuit which is functionally the same as FIG. 5 is shown in FIG. 6. Here the PNP transistor 40 is replaced by the composite PNP transistor made up of transistors 64 and 66. The voltage source 39 is achieved by using two diodes 68 and 70 in series with the base of transistor 66 together with a resistor 72 connected from the transistor base to a voltage source $V_{cc}$ of higher potential (e.g. 5V supply). As long as resistor 72 is chosen such that $I_R$ is always much larger than $I_B$, a relatively constant voltage exists across the two diodes and the effect of a voltage source is achieved.

Reference is now made to the table below for an example of possible operating conditions for a 64 × 64 or 4K array. The currents are given both as total line currents and as source current per cell.

TABLE

| | Possible operating conditions for 4K array | | |
|---|---|---|---|
| LINE | READ | WRITE (TRANSISTOR 14 ON) | STANDBY |
| X (upper) | ~1.53mA | 4.57μA .0714μA/cell | 32μA .5μA/cell |
| X (lower) | 1.0V | 1.1V | 1.1V |
| Y | 32μA w/sensor | 224μA 3.5μA/cell | 32μA .5μA/cell |

It will be seen from the table above that each of the switching transistors 12 and 14 requires a $\beta$ in the range of $7 < \beta < 49$ for this example just described.

Other $\beta$ ranges can be used by changing the write currents. For example, if the write currents are selected such that the y write current is 5 times standby current and the x write current is 1/5 times standby when turning transistor 14 on, then an acceptable range of $\beta$ is $5 < \beta < 25$. A broad range of device parameters is thus possible.

Figure 8:
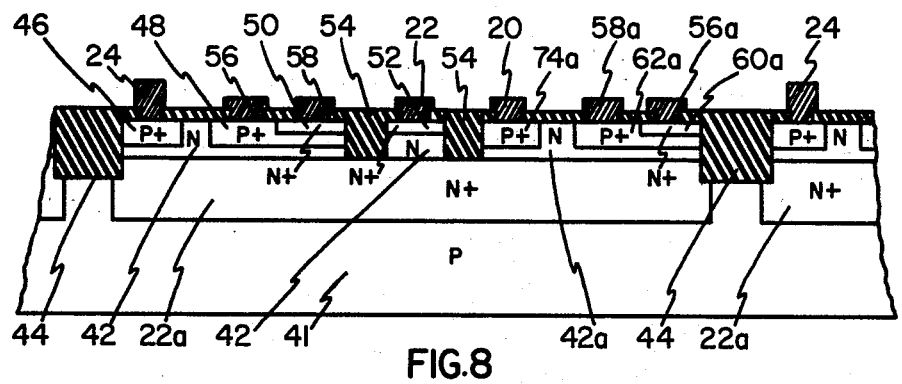
FIG. 8 is a sectional view taken along line 8—8 of FIG. 7.
Figure 7:
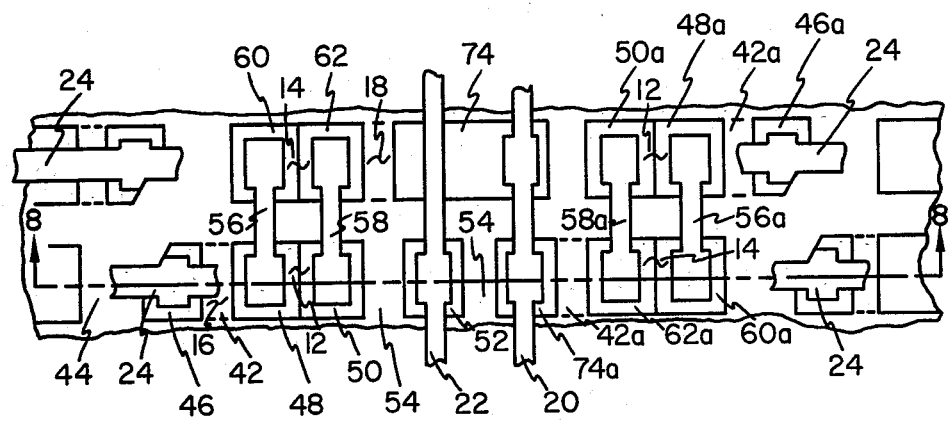
FIG. 7 is a plan view of a layout of the memory cell according to the invention.

A typical layout for the memory cell 10 is shown in FIGS. 7 and 8. In a P type substrate 41, the lower x address lines 22 are provided by buried diffused N+ regions 22a separated from each other. The width of the buried regions 22a spans across two cells 10.

Immediately above the buried regions 22a is an N type epitaxial layer or region 42 in which oxide isolation regions 44 may be grown. The oxide isolation regions 44 extend a sufficient depth into the epitaxial layer 42 to contact the lateral extremities of the buried regions 22a. Two P+ regions 46 and 48 are spaced apart within the N type region 42 to form two PN junctions therewith. An N+ region 50 within the P+ region 48 forms a PN junction therewith. The P+, N, P+ type regions 46, 42, and 48 form, respectively, the emitter, base, collector elements of a PNP lateral transistor constituting source transistor 16, and the N, P+, N+ regions 42, 48 and 50 form, respectively, the emitter, base, collector elements of an NPN vertical transistor constituting the switching transistor 12. It is seen that the junction between regions 42 and 48 serves as both the base-collector junction of source transistor 16 as well as the emitter-base junction of switching transistor 12.

An N+ region 52 within the N region 42 located midway between the lateral extremities of the buried region 22a and extending to the surface of the epitaxial layer 42 serves as the surface contact for the buried diffused layer 22a, which is the lower x address line 22. Two oxide insulating regions 54, one on each side of the N+ region 52 and extending to the buried region 22a, provide isolation between the transistor 12 and 16 on one side thereof and the other pair of transistors 14 and 18 of the next cell 10 on the other side thereof. As will be seen in FIG. 8, the other pair of transistors 14 and 18 of the next cell 10 are formed in a similar manner to that employed for transistors 12 and 16. Thus, a P+ region 74a, an N region 42a, and a P+ region 62a form the emitter, base, collector of the PNP source transistor 18, and N region 42a, P+ region 62a, N+ region 60a form the emitter, base, collector of the NPN switching transistor 14.

It should be recalled that for this application, as with other I²L circuits, the NPN collector is the surface N+ region 50 or 60.

FIG. 7 in plan view shows how the four transistors 12, 14, 16, 18 may be grouped together in a single cell. The two switching transistors 12 and 14 are located side by side, with the two source transistors 16 and 18 located adjacent diagonally opposing ends of the switching transistors 12 and 14. The switching transistors 12 and 14 are arranged so that they appear in vertical cross section as reversed images of each other to facilitate cross connections of the collectors and bases. For instance, a conductor 56 connects the base 48 of transistor 12 to the collector 60 of transistor 14, and another conductor 58 connects the collector 50 of transistor 12 to the base 62 of transistor 14. Also, in the adjacent cell shown, a conductor 56a connects the base 48a of transistor 12 to the collector 60a of transistor 14, and a conductor 58a connects the collector 50a of transistor 12 to the base 62a of transistor 14.

The y address lines 24 connect to the emitter regions 46 of one source transistor 16 and the upper x address lines 20 connect to the emitter regions 74 of the other source transistor 18.

Various other layouts may be used to realize the same electrical circuit. Even the process may be changed so that the circuit may be realized with a diffused isolation process or with a P-epitaxial layer. The circuit could even be realized with vertical PNP switching transistors and lateral NPN source transistors by reversing all P and N layers and reversing the polarity of all voltage and current sources. The operation would still be essentially as described above.

It is also possible to operate the memory cell of the invention by using current sources on the lower x address lines and voltage sources on the y address and upper x address lines. The principles of writing remain the same, but the voltages would be varied to achieve the current difference necessary to write the selected cell. In such an operating scheme it might prove convenient to supply more or less current to the upper x address lines than is supplied to the y address lines during standby to achieve a fast, easy read cycle. A very small difference in address line voltage can cause large changes in current so current differences are easily achieved. Also, the read operation could be designed to detect a large (10% to 50%) current difference possible when the voltage of the selected y address line and the dummy y address line are kept the same.

In summary, there is described a semiconductor memory cell that uses fewer devices than most static cells and the devices are merged so as to yield a design which can be extremely small. Operation with fewer parts and lines other than cells is possible through the combined function of certain parts. The transistor load devices are also used as data coupling devices. Also, the select lines are used to supply power to the cell as well as to write information into the cell and read information from the cell. This reduces the number of lines needed per cell. The result is a memory cell which can occupy an area of less than 1 mil$^2$ with standard photolithographic techniques and 2 $\mu$ misalignment rules. This makes a 4K and 16K random access memory imminently feasible.

What is claimed is:

1. A memory cell, comprising:
   (a) first, second, and third address lines,
   (b) first and second switching transistors each having base, emitter, and collector terminals, with their base terminals cross coupled to their collector terminals to form first and second node points and their emitters connected to said second address line,
   (c) a first source transistor having base, emitter and collector terminals, with its base terminal connected to said second address line, its emitter terminal connected to said third address line, and its collector terminal connected to said second node point, and
   (d) a second source transistor having base, emitter, and collector terminals, with its base terminal connected to said second address line, its emitter terminal connected to said first address line, and its collector terminal connected to said first node point.

2. The invention according to claim 1 and further including a dummy line, and means connected between said dummy line and said second and third address lines for sensing the state of said memory cell.

3. The invention according to claim 2, wherein said sensing means includes a dummy transistor having base, emitter, and collector terminals, with its base and collector terminals connected to said second address line and its emitter terminal connected to said dummy line, and said sensing means further including a differential amplifier connected between said third address line and said dummy line.

4. The invention according to claim 1, wherein said switching transistors are of first conductivity type and said source transistors are of second conductivity type opposite said first conductivity type.

5. A memory, comprising:
   (a) a plurality of pairs of address lines extending in a given direction, each address line pair including a first address line and a second address line,
   (b) a like plurality of third address lines, one for each of said address line pairs, extending in a direction transverse to said given direction, and forming with said address line pairs a plurality of address line groupings each of which includes one each of said first, second, and third address lines,
   (c) a plurality of memory cells arranged adjacent to and interconnected with said address line groupings, there being a memory cell for each one of said address line groupings and each memory cell connected with a respectively different address line grouping, each of said memory cells comprising:
      (1) first and second switching transistors each having base, emitter, and collector terminals, with their base terminals cross coupled to their collector terminals to form first and second node points and their emitter terminals connected to one of said second address lines,
      (2) A first source transistor having base, emitter and collector terminals, with its base terminal connected to said one second address line, its emitter terminal connected to one of said third address lines and its collector terminal connected to said second node point, and
      (3) a second source transistor having base, emitter, and collector terminals, with its base terminal connected to said one second address line, its emitter terminal connected to one of said first address lines, and its collector terminal connected to said first node point.

6. The invention according to claim 5 and further including means for applying write signals to a selected one of each of said first and third address lines.

7. The invention according to claim 6 and further including means for applying a read signal selectively to each of said first address lines, and means coupled between said second and third address lines for sensing the respective states of each of said memory cells selectively.

8. The invention according to claim 5, and further including means for applying standby current $I_s$ to all of said first and third address lines except a selected one of said first address lines and a selected one of said third address lines, means for applying a write current $I_s/m$ to said selected first address line, and means for applying a write current $nI_s$ to said selected third address line, wherein $m$ and $n$ are greater than 1 and less than the effective current gain, $\beta$, of each of said switching transistors and where $mn > \beta$.

9. The invention according to claim 5 and further including means for writing a selected cell by supplying current to said first and third address lines such that the ratio of currents supplied to said first and third address lines is less than the effective current gain, $\beta$, of the switching transistors on all crossing pairs of address lines except the two selected address lines, and such that on the two selected address lines the current ratio is greater than the effective current gain, $\beta$.

10. The invention according to claim 9 and further including a dummy line, and means connected between said dummy line and said second and third address lines for sensing the respective states of said memory cells.

11. The invention according to claim 10 and further including means for applying a potential to each of said second address lines selectively during a read operation that is different from a potential applied thereto during a write operation, such that all of the source transistors of the memory cells connected to a selected second address line will draw increased current from the third address lines relative to the remaining source transistors, thereby giving an indication of the respective states of the selected memory cells.

12. A memory cell, comprising:
   (a) not more than three address lines, and
   (b) not more than four transistors connected between said address lines to form a bistable device capable of storing information received from said address lines during a write operation and transmitting said information to said address lines during a read operation, two of said transistors being interconnected at three node points to form a flip-flop, a third transistor being connected directly between a first and second one of said address lines and a first node point, and a fourth transistor being connected between said first address line, a third address line, and a second node point, the third node point being connected in common with said first address line.

13. A memory cell, comprising:
(a) not more than three address lines, and
(b) not more than four transistors connected between said address lines to form a bistable device capable of storing information received from said address lines during a write operation and transmitting said information to said address lines during a read operation a first and a second one of said transistors being interconnected at three node points to form a flip-flop, a third transistor connected in series with said second transistor between one pair of said address lines, and a fourth transistor connected in series with said first transistor between another pair of said address lines sharing a common address line with said one pair.

14. A memory cell, comprising:
(a) first and second address lines;
(b) a common line; and
(c) a bistable device connected between said lines;
(d) said bistable device including (1) first and second transistors having their respective bases cross coupled with their collectors to form two node points, and having their emitters connected directly to said common line, (2) a third transistor having its emitter connected directly to said first address line, its base connected directly to said common line, and its collector connected directly to one of said node points, and (3) a fourth transistor having its emitter connected directly to said second address line, its base connected directly to said common line and its collector connected directly to the other one of said node points.

15. The invention according to claim 5, and further including means for applying standby current $I_s$ to all of said first and third address lines except a selected one of said first address lines and a selected one of said third address lines, means for applying a write current $I_s/m$ to said selected third address line, and means for applying a write current $nI_s$ to said selected first address line, wherein $m$ and $n$ are greater than 1 and less than the effective current gain, $\beta$, of each of said switching transistors and where $mn > \beta$.

16. A memory comprising a set of $x$ address lines, a set of $y$ address lines, a plurality of static transistor memory cells arrayed in rows and columns with each row connected to an $x$ address line and each column connected to a $y$ address line, means for supplying currents to the $x$ and $y$ address lines to maintain the cells in a standby condition, and means for selectively addressing one memory cell of the array for a write operation, said selective addressing means comprising means for increasing the current supplied to one of the two lines comprising an $x$ address line and a $y$ address line of the selected cell, while decreasing the current supplied to the other one of the two lines of the selected cell, by fixed amounts related to the current gain of the memory cell transistor.

17. A memory according to claim 16 wherein the ratio of the currents supplied to the $x$ and $y$ address lines during standby condition is a value that is less than the current gain of the memory cell transistor.

18. A memory according to claim 16 wherein the steady state currents in both standby and write operation are directed into the cells from the $x$ and $y$ address lines.

* * * * *